(12) United States Patent
Deng et al.

(10) Patent No.: US 12,735,313 B2
(45) Date of Patent: Sep. 15, 2026

(54) MEMS DIE AND MEMS-BASED VIBRATION SENSOR

(71) Applicant: Knowles Electronics, LLC, Itasca, IL (US)

(72) Inventors: Ken Deng, Schaumburg, IL (US); Michael Pedersen, Long Grove, IL (US); Richard Li-Chen Chen, Zhubei City (TW); Shubham Shubham, Schaumburg, IL (US); Faisal Zaman, Naperville, IL (US)

(73) Assignee: Knowles Electronics, LLC, Itasca, IL (US)

( * ) Notice: Subject to any disclaimer, the term of this patent is extended or adjusted under 35 U.S.C. 154(b) by 1027 days.

(21) Appl. No.: 17/869,870

(22) Filed: Jul. 21, 2022

(65) Prior Publication Data

US 2023/0192475 A1 Jun. 22, 2023

Related U.S. Application Data

(60) Provisional application No. 63/292,158, filed on Dec. 21, 2021.

(51) Int. Cl.

| | |
|---|---|
| ***G01C 19/5755*** | (2012.01) |
| ***B81B 3/00*** | (2006.01) |
| ***G01H 11/06*** | (2006.01) |

(52) U.S. Cl.

CPC ........ *B81B 3/0051* (2013.01); *G01C 19/5755* (2013.01); *G01H 11/06* (2013.01); *B81B 2201/0235* (2013.01); *B81B 2201/0285* (2013.01); *B81B 2203/0163* (2013.01); *B81B 2203/0307* (2013.01); *B81B 2203/04* (2013.01); *B81B 2203/055* (2013.01)

(58) Field of Classification Search

CPC ........ G01C 19/5755; B81B 2201/0235; B81B 2201/0285; B81B 2203/0307; B81B 2203/04

See application file for complete search history.

(56) References Cited

U.S. PATENT DOCUMENTS

2016/0185592 A1* 6/2016 Hsieh .................... B81B 3/0005 118/723 R
2018/0230005 A1* 8/2018 Lee ...................... B81B 7/0048
2018/0283867 A1* 10/2018 Ruohio ............. G01C 19/5747

(Continued)

FOREIGN PATENT DOCUMENTS

CN 104204815 A 12/2014
CN 214936041 U 11/2021

*Primary Examiner* — Chad M Dicke
*Assistant Examiner* — Valerie N Newton
(74) *Attorney, Agent, or Firm* — FLENER IP & BUSINESS LAW; Zareefa B. Flener; Yongae Jun

(57) ABSTRACT

A vibration sensor/accelerometer includes, in various implementations, a MEMS die that includes a plate having an aperture, an anchor disposed within the aperture, a plurality of arms (e.g., rigid arms) extending from the anchor, and a plurality of resilient members (e.g., looped or folded springs with a carefully designed spring stiffness), each resilient member connecting the plate to an arm of the plurality of arms. The plate may be made from a solid layer in which the resilient members are etched from the same layer. The MEMS die may also include top and bottom wafers, and travel stoppers extending from the top and bottom wafers as well as through the plate.

12 Claims, 6 Drawing Sheets

(56) References Cited

U.S. PATENT DOCUMENTS

2019/0152766 A1* 5/2019 Kuang .................. G01P 15/125
2022/0178696 A1* 6/2022 Kaajakari .......... G01C 19/5649
2023/0348259 A1* 11/2023 Chong ................ G01P 15/0802

* cited by examiner

MEMS DIE AND MEMS-BASED VIBRATION SENSOR

CROSS-REFERENCE TO RELATED APPLICATIONS

This application claims the priority benefit of U.S. Provisional Application No. 63/292,158, filed on Dec. 21, 2021 and incorporated herein by reference in its entirety.

FIELD OF THE DISCLOSURE

The present disclosure relates to microelectromechanical systems (MEMS) dies and MEMS-based vibration sensors or accelerometers, and more particularly to MEMS dies and MEMS-based vibration sensors or accelerometers having a translational out-of-plane Z-axis proof mass displacement.

BACKGROUND

A Z-axis accelerometer senses out-of-plane vibration. Compared to in-plane X-axis and Y-axis sensors it is the most challenging sensor for an engineer to design. Referring to FIG. 1, prior art Z-axis accelerometers utilize a rotational proof-mass (PM) plate 20, aka a 'see-saw' or 'teeter-totter' PM 20, which rotates around an axis 10 as illustrated by the arrows 40 on torsional springs 30. A parallel sensing capacitor 50 is formed between the PM 20 and a bottom electrode 60 on a bottom wafer or between the PM 20 and a top electrode on a cap wafer (not shown). Since the PM 20 displacement is not uniform and it is linearly proportional to the distance from the rotation axis 10, the maximum effective sensing area that can be achieved in this geometry is 50% of the PM 20 area.

Chinese patent CN214936041U discloses a proof mass 100 supported by resilient structures 108 on an anchor 207. The resilient members 108 are disposed proximate to the anchor 207, which allows the proof mass 100 to freely move in three dimensions as well as rotationally around the anchor 207.

DRAWINGS

The foregoing and other features of the present disclosure will become more fully apparent from the following description and appended claims, taken in conjunction with the accompanying drawings. These drawings depict only several embodiments in accordance with the disclosure and are, therefore, not to be considered limiting of its scope.

DETAILED DESCRIPTION

According to an embodiment, a MEMS die comprises a plate having an aperture, an anchor disposed within the aperture, a plurality of arms extending from the anchor, and a plurality of resilient members, wherein each resilient member connects the plate to an arm of the plurality of arms. In an embodiment the plate functions as a proof mass. In an embodiment each of the resilient members is a looped or folded spring, and in an embodiment each of the springs has a stiffness that is smaller with respect to movement of the spring along the Z-axis than with respect to movement along the X-axis and along the Y-axis.

According to an embodiment, the plate is made from a solid layer, in which the plurality of resilient members, the anchor, and the plurality of arms are etched from the solid layer. In an embodiment the MEMS die further comprises top and bottom wafers, and travel stoppers extending from the top and bottom wafers toward the plate, wherein one or more of the travel stoppers extends through the plate. In an embodiment the MEMS die further comprises an electrode, wherein the electrode and the plate form a parallel plate capacitor. In an embodiment a vibration sensor or accelerometer comprises the MEMS die as described above, and further comprises an integrated circuit that receives signals from the MEMS die representing a change in capacitance, wherein the integrated circuit outputs motion data and/or orientation data based on the received signals.

In an embodiment, the plurality of arms comprises three or more arms. In an embodiment a first distance between any one of the three or more resilient members and a closest outer edge of the proof mass is less than a second distance between the one resilient member and the anchor. In an embodiment the resonance frequency for translational motion of the proof mass perpendicular to the plane of the proof mass is less than the resonance frequency for translational motion along or rotational motion around any other axis.

Figures 1, 2:
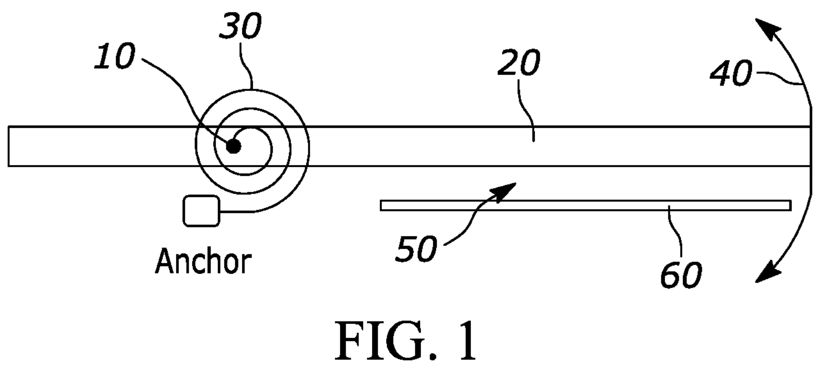
FIG. 1 illustrates an exemplary prior art teeter-totter Z-axis accelerometer or vibration sensor.
FIG. 2 illustrates an exemplary translational Z-axis accelerometer or vibration sensor, according to an embodiment.

Described herein are various embodiments of microelectromechanical systems (MEMS) dies and vibration sensors/accelerometers that incorporate such MEMS dies. For example, as schematically illustrated in FIG. 2, an exemplary embodiment of a Z-axis sensor 100 includes a proof mass (PM) 20 mounted to translate in the Z-axis direction on springs 32. A parallel plate sensing capacitor 50 is formed between the PM 20 and a bottom electrode 60. The arrangement of the proof mass 20 on the springs 32 generates translational uniform out-of-plane displacement (along the Z-axis) of the PM 20 rather than a rotational displacement or displacement in other directions during vibration. Therefore, the Z-axis sensor 100 has an effective sensing area that may be 100% of the area of the PM 20. Consequently, the capacitive sensitivity of the present disclosure is greatly improved over, and may be more than double that of, the teeter-totter design.

Figure 3:
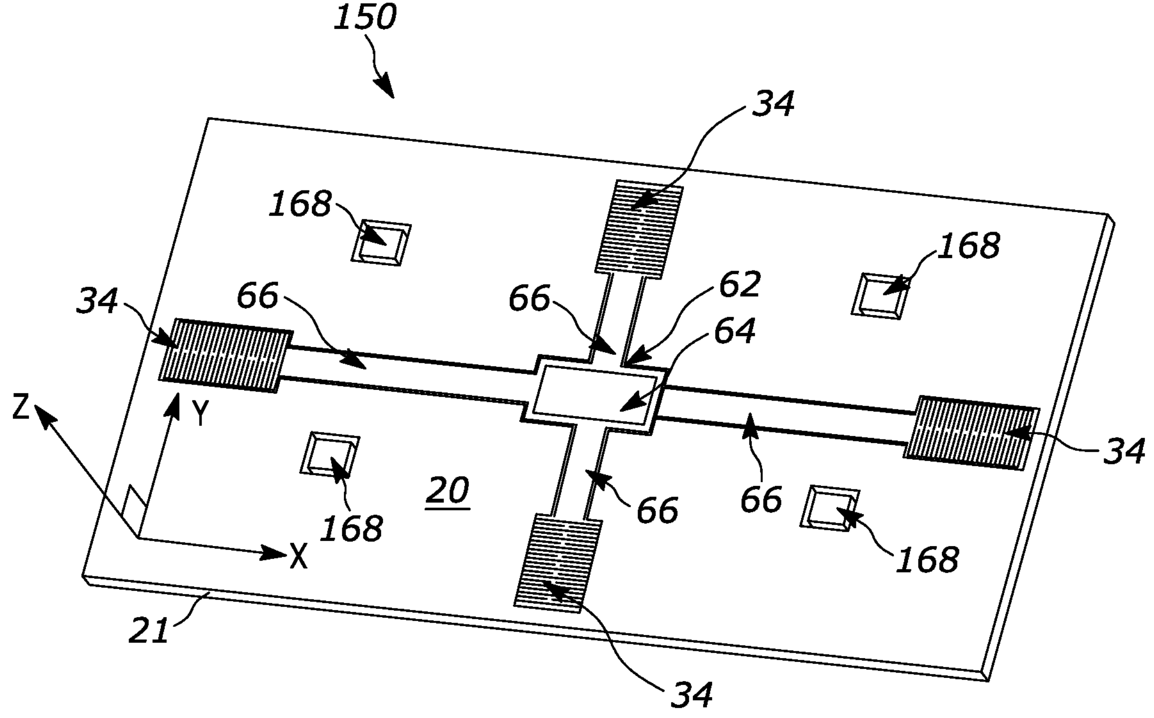
FIG. 3 is a perspective view of a MEMS die for an accelerometer or vibration sensor, according to an embodiment.
Figure 4:
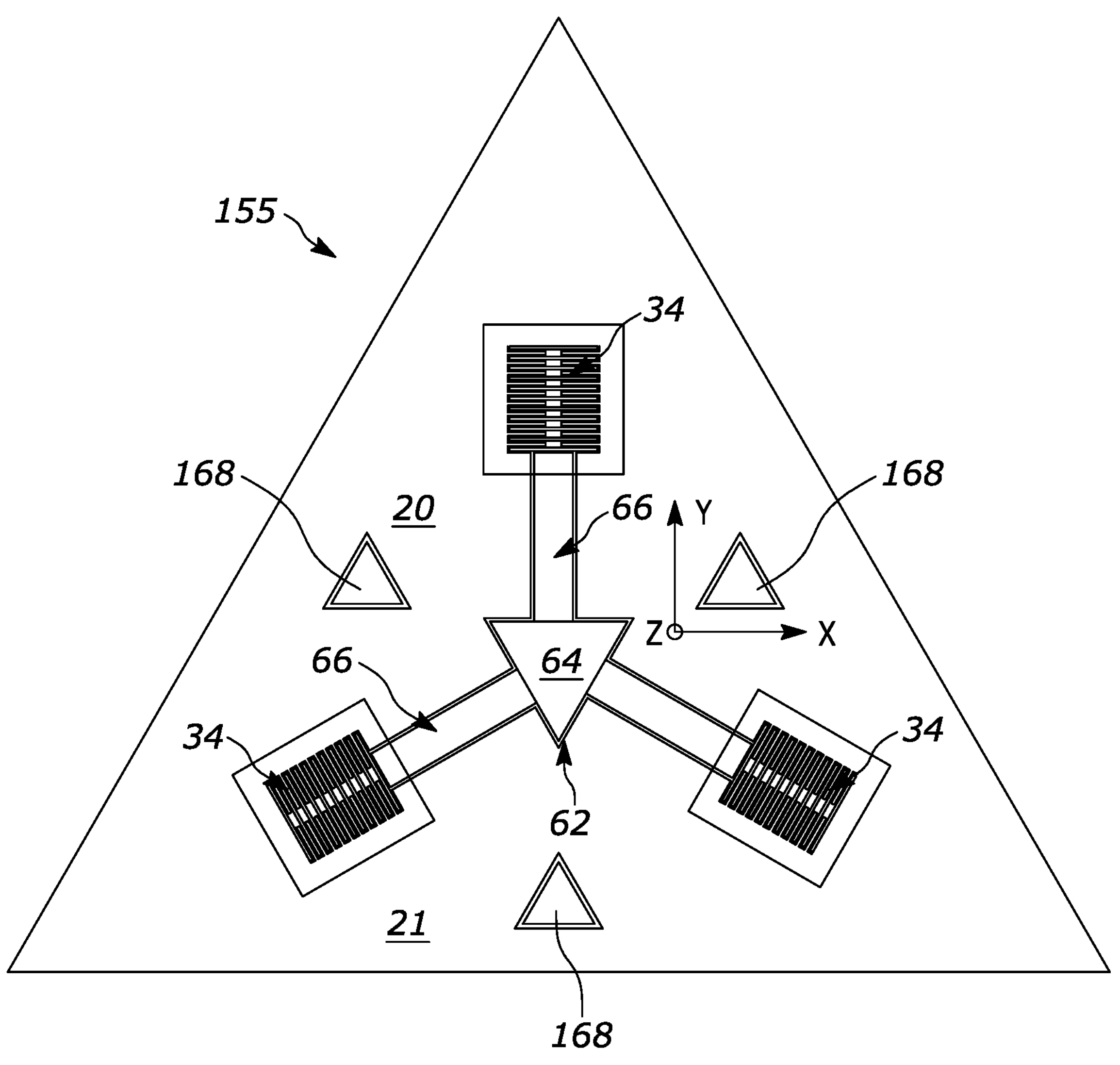
FIG. 4 is a top view of a MEMS die for an accelerometer or vibration sensor, according to another embodiment.
Figure 5:
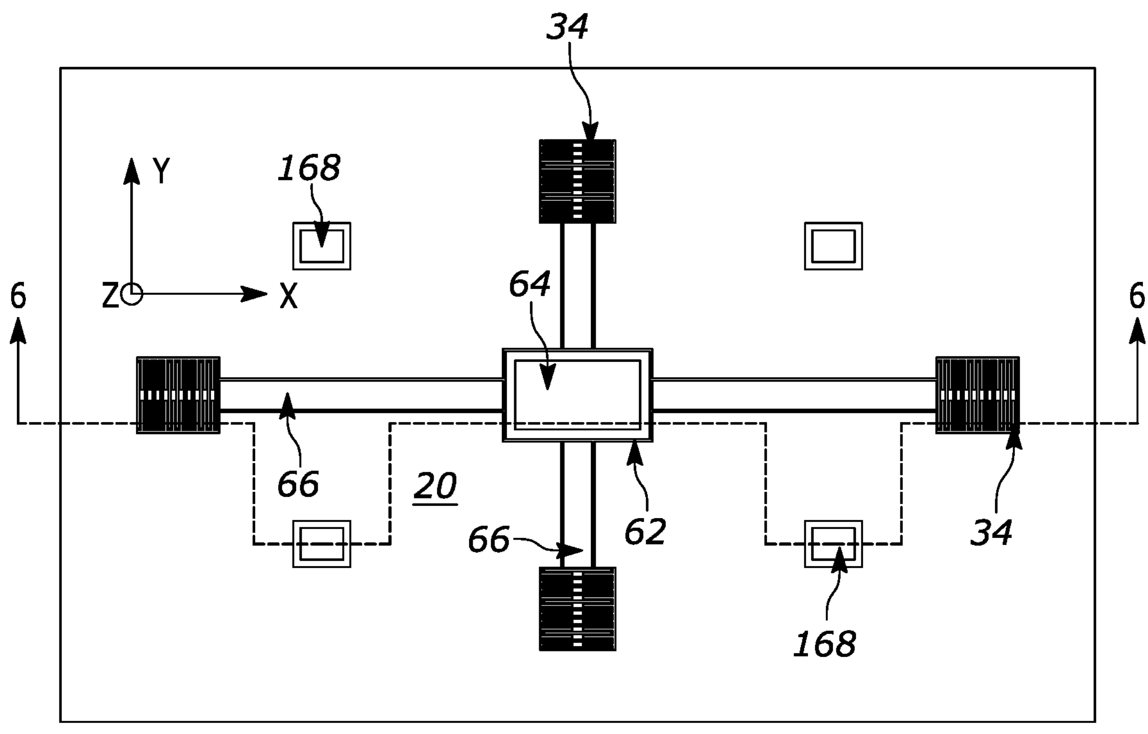
FIG. 5 is a top view of the MEMS die for an accelerometer or vibration sensor shown in FIG. 3.

Referring to FIGS. 3-5, exemplary embodiments of a MEMS die 150, 155 for a Z-axis sensor includes a PM 20 in the form of a flat plate made from a solid layer 21 (for example without limitation, made of silicon). The solid layer 21 is illustrated to define an X-Y plane in FIGS. 3-5 so that a Z axis relative to the X-Y plane is oriented perpendicular to the solid layer 21 as shown in FIG. 3 and coming straight out of the page at the reader in FIGS. 4 and 5. In an embodiment the PM 20 has an aperture 62 disposed therethrough. In an embodiment the aperture 62 is generally centered on the PM 20.

In an embodiment, a plurality of resilient members 34, for example springs 34 etched from the layer 21 are integrally connected with the PM 20. As more fully described hereinbelow, various embodiments of the springs 34 have particular structural geometries and are disposed at locations within the PM 20 such that the springs 34 provide a highest compliance for out-of-plane (along the Z-axis) translation, and much smaller compliances for translations in all other directions or for rotations around any axis.

In an embodiment the MEMS die 150, 155 includes a centralized anchor 64 and a plurality of arms 66 that connect the springs 34 to the anchor 64. In an embodiment there are three arms 66 (see FIG. 4); however, in other embodiments there are four (see FIGS. 3 and 5), five, six, or more arms 66. In an embodiment the plurality of arms 66 is rigid. In an embodiment, the PM 20, the plurality of resilient members 34, the anchor 64, and the plurality of arms 66 are all etched from the solid layer 21. The length and rigidity of the arms 66 determines where on the PM 20 that the springs 34 are disposed. Besides their particular structural geometries, the locations of the resilient members 34 relative to the PM 20 also impact compliance of the PM 20 in three dimensional space.

For example, CN214936041U cited above discloses a proof mass 100 supported by resilient structures 108 disposed directly on an anchor 207. The close proximity of the resilient members 108 to the anchor 207 promotes a mixed motion including translation of the proof mass 100 in three dimensions as well as rotation around the anchor 207. Such a mixed motion of the proof mass 100 provides no isolation of any particular mode of vibration and also generates a relatively noisy signal. In contrast to the structure disclosed in CN214936041U, the structure of the MEMS die 150, 155 demonstrates a highly selective stiffness in three dimensional space, in particular by having the least stiffness in the Z-axis direction. This selective stiffness is achieved at least in part by disposing the resilient members 34 on the arms 66 such that a first distance between any one of the three or more resilient members 34 and a closest outer edge of the proof mass 20 is less than a second distance between the one resilient member 34 and the anchor 64. In addition, the each of the resilient members 34 has a stiffness that is smaller with respect to movement of the resilient member 34 along the Z-axis than with respect to movement along the X-axis and along the Y-axis. Thus the combination of where the resilient members 34 are located relative to the PM 20, and the particular structural geometries of the resilient members 34 contributes to a dominant motion of the PM 20 in the Z-axis direction.

Consequently, when the structure of the MEMS die 150, 155 is placed in a vibration environment, the induced out-of-plane translation of the PM 20 in the Z-axis direction is dominant and the translations in all other directions (and rotations around any axis) are much smaller. It follows that the resonance frequency for translational motion of the PM 20 in the Z-axis direction is less than the resonance frequency for translational motion along or rotational motion around any other axis. Without being held to any particular theory, isolating the dominant mode of vibration in the Z-axis direction also produces a cleaner less noisy signal than does a mixed mode of vibration.

Figure 6:
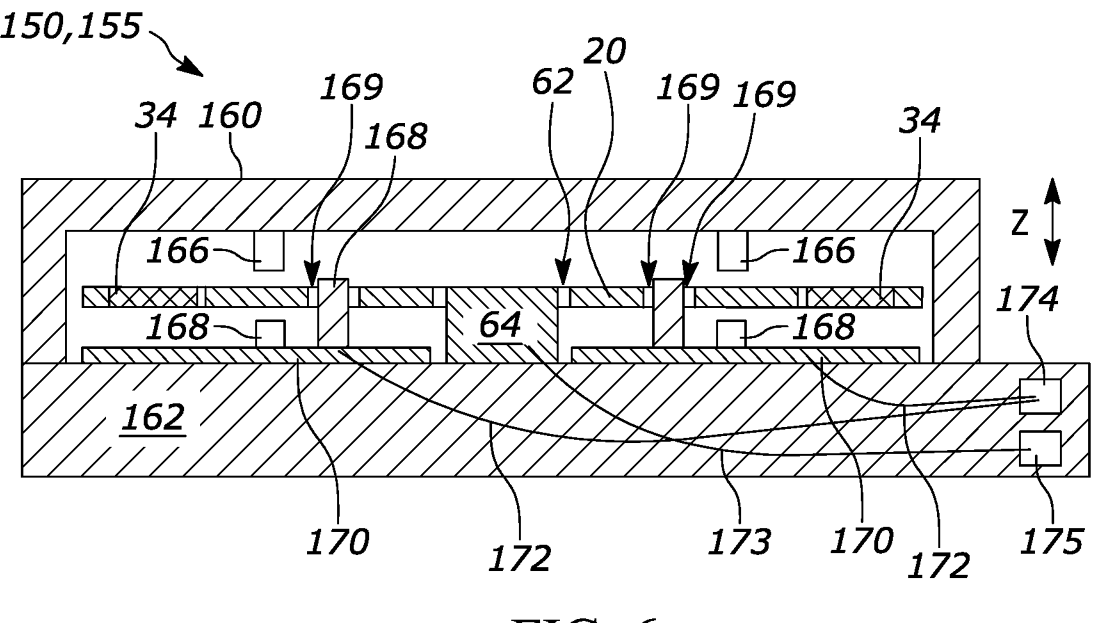
FIG. 6 is a cross-sectional schematic illustration taken generally along the line 6-6 in FIG. 5.

Referring to FIG. 6, in an embodiment the MEMS die 150, 155 comprises a top wafer substrate 160 that encloses the PM 20 and a bottom wafer substrate 162 that supports the anchor 64. To ensure the robustness of the MEMS die 150, 155, in an embodiment, travel stoppers 166 extend from the top wafer substrate 160 toward the PM 20 and travel stoppers 168 extend from the bottom wafer 162 toward the PM 20. Spaces left between the travel stoppers 166, 168 and the PM 20 limit the travel of the PM 20 during dynamic shocks, which helps ensure that the MEMS die 150, 155 can survive high dynamic impacts in use, for example, as part of a vibration or acceleration sensor.

In an embodiment one or more of the travel stoppers 166, 168 extend through the PM 20 in the Z-axis direction, and small gaps 169 (see FIG. 6) left between the travel stoppers 166, 168 and the PM 20 further limit the lateral motion of the PM 20 in the X-Y plane. In an embodiment one or more of the travel stoppers 166, 168 extend through the PM 20 in the Z-axis direction, with a first end of the one or more of the travel stoppers 166, 168 attached to the top wafer substrate 160 and a second end of the one or more of the travel stoppers 166, 168 attached to the bottom wafer 162.

Figure 7:
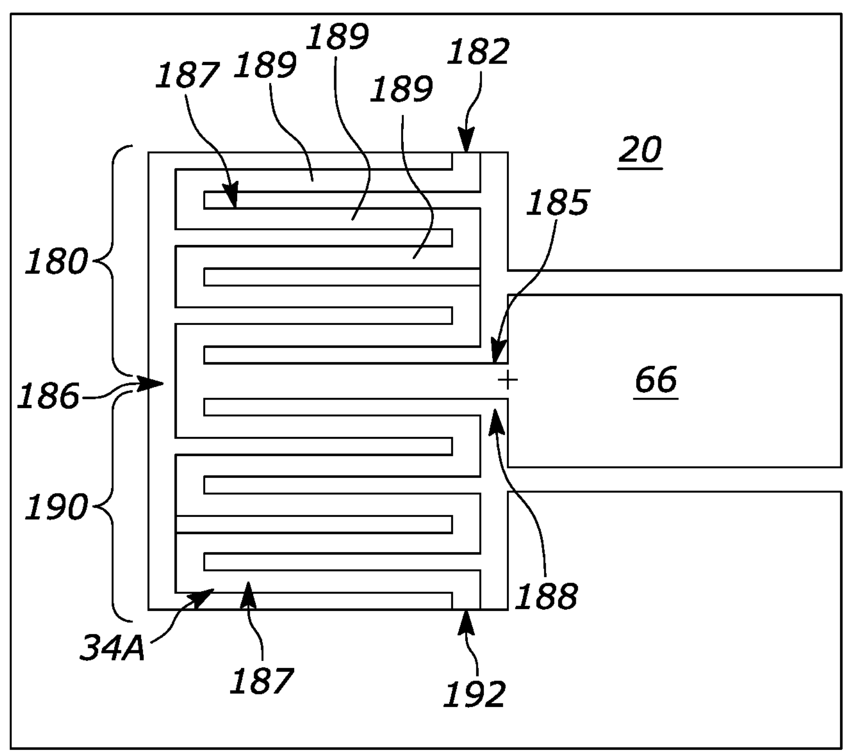
FIG. 7 is a plan view of an exemplary folded spring, according to an embodiment.
Figure 8:
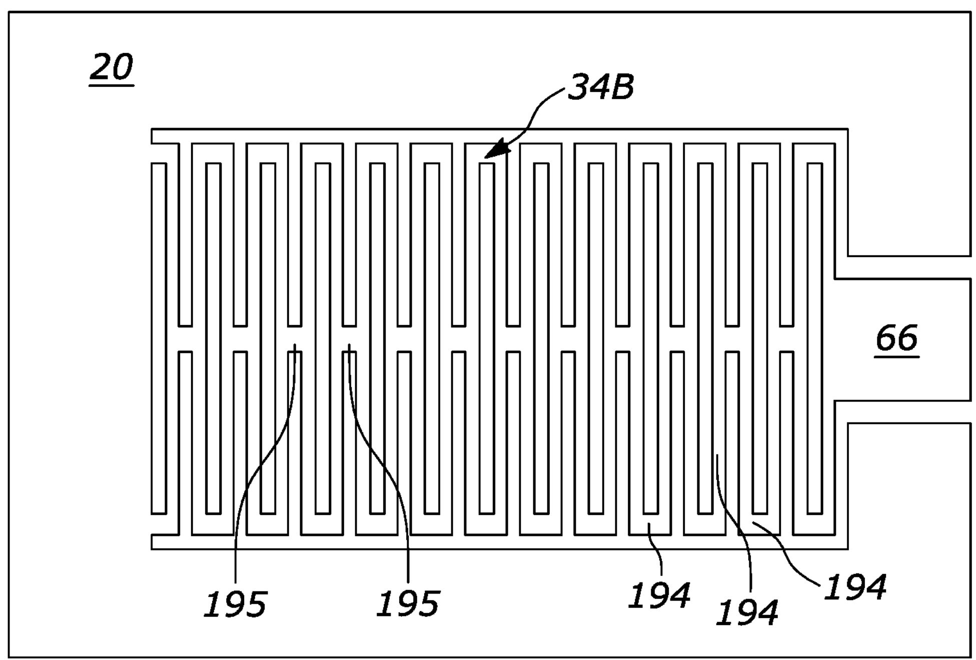
FIG. 8 is a plan view of an exemplary looped spring, according to an embodiment.

Referring to FIGS. 7 and 8, in various embodiments the three or more resilient members 34 are folded springs 34A (FIG. 7) or looped springs 34B (FIG. 8). As illustrated in FIG. 7, in an embodiment a folded spring 34A comprises portions 180, 190 that extend laterally from a first end 186 of a base member 185 that attaches at a second end 188 to an arm 66. Each of the portions 180, 190 comprises a structure 187 having structural folds 189 that traverse back and forth parallel to the base member 185 while also extending laterally away from the base member 185. The structure 187 ultimately connects to the PM 20 at connecting portions 182, 192 that extend from the last structural fold 189 nearest to the PM 20 at an end of the structural fold 189 closer to the second end 188 of the base member 185.

Referring to FIG. 8, in an embodiment a looped spring 34B a plurality of structural loops 194, wherein individual structural loops 194 are connected to one another via loop connectors 195. In an embodiment a first structural loop 194 of the plurality of structural loops 194 attaches to an end of an arm 66, for example, extending from an end of the arm 66 or extending from lateral sides of the arm 66. At an opposite end of the looped spring 34B, the last structural loop 194 attaches to the PM 20 along a side of the structural loop 194 or by extending into the PM 20 effectively including the PM 20 as a side of the structural loop 194 (see FIG. 8).

Referring again to FIG. 6, in an embodiment the MEMS die 150, 155 includes one or more electrodes 170, wherein the electrodes 170 and the PM 20 form a parallel plate capacitor. In an embodiment the one or more electrodes 170 are disposed along the bottom wafer substrate 162; however, in other embodiments the one or more electrodes 170 are disposed along the top wafer substrate 160. Vibration induced uniform out-of-plane movement of the PM 20 relative to the one or more electrodes 170 changes the spacing between the PM 20 and the one or more electrodes 170, which causes a measurable change in capacitance.

In an embodiment each of the one or more electrodes 170 includes an electrical connection shown schematically as a wire or trace 172 that, for example, connects to a bond pad 174. The PM 20 plate, for example made from doped Silicon, disposed on the other side of the parallel plate capacitor includes another electrical connection shown schematically as another wire or trace 173 that, for example, connects to a bond pad 175

Figure 9:
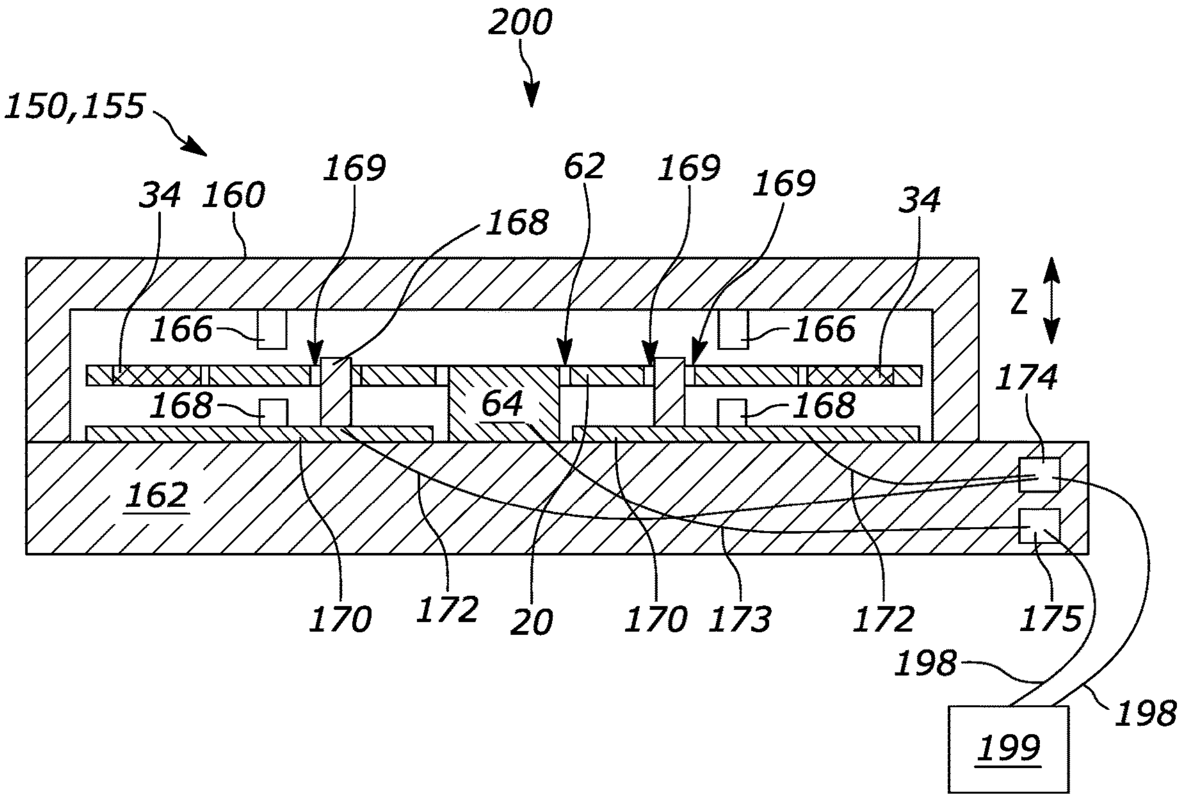
FIG. 9 is a schematic illustration of an exemplary MEMS die electrically connected with in integrated circuit, according to an embodiment.

Referring to FIG. 9, in an embodiment a vibration sensor or accelerometer 200 comprises the MEMS die 150, 155 illustrated in FIG. 6 and an integrated circuit 199 (e.g., an application-specific integrated circuit (ASIC) electrically connected to the MEMS die 150, 155, for example by wires or traces 198. The integrated circuit 199 receives signals from the MEMS die 150, 155, the signals representing the change in capacitance caused by vibration of the PM 20 in the Z-axis direction. In an embodiment the integrated circuit 199 outputs motion data and/or orientation data based on the received signals.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments.

Steps in a production process utilized to produce the any of the MEMS die 150, 155 as described hereinabove include etching, masking, patterning, cutting, boring, and/or release steps executed on a workpiece. All of the steps are not described in detail herein. However, generally the portions of the workpiece that ultimately end up as the structure of the MEMS die 150, 155 are layered onto the workpiece using sacrificial material, or otherwise bored or etched out of a solid block of material, for example, in the case of the integrally connected PM 20, resilient members 34, arms 66, and anchor 64.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the disclosure be defined by the claims appended hereto and their equivalents.

What is claimed is:

1. A microelectromechanical systems (MEMS) die comprising:

a plate having an aperture, wherein the plate functions as a proof mass;

an anchor disposed within the aperture;

a plurality of arms extending from the anchor; and a plurality of resilient members, each resilient member is a looped or folded spring connecting the plate to a corresponding arm of the plurality of arms; and wherein each of the springs has a stiffness that is smaller with respect to movement of the spring along the Z-axis than with respect to movement along the X-axis and along the Y-axis.

2. The MEMS die of claim 1, wherein the plate is an etched solid layer comprising the plurality of resilient members, the anchor, and the plurality of arms.

3. The MEMS die of claim 1, further comprising top and bottom wafers, and travel stoppers extending from the top and bottom wafers toward the plate, wherein one or more of the travel stoppers extends through the plate.

4. The MEMS die of claim 1, further comprising an electrode, wherein the electrode and the plate form a parallel plate capacitor.

5. A microelectromechanical systems (MEMS) die comprising:

a proof mass having an aperture disposed through a geometric center of the proof mass;

an anchor disposed within the aperture;

three or more arms extending from the anchor; and three or more resilient members, wherein each of the resilient members is a looped or folded spring, each resilient member connecting the proof mass to an arm of the three or more arms; and further comprising an electrode, wherein the electrode and the proof mass form a parallel capacitor.

6. The MEMS die of claim 5, wherein the proof mass is an etched solid layer comprising the three or more resilient members, the anchor, and the three or more arms.

7. The MEMS die of claim 6, wherein a first distance between any one of the three or more resilient members and a closest outer edge of the proof mass is less than a second distance between the one resilient member and the anchor.

8. The MEMS die of claim 5, further comprising top and bottom wafers, and travel stoppers extending from the top and bottom wafers toward the proof mass, wherein one or more of the travel stoppers extends through the proof mass.

9. A microelectromechanical systems (MEMS) die comprising:

a proof mass having an aperture disposed through a geometric center of the proof mass;

an anchor disposed within the aperture;

four or more rigid arms extending from the anchor; and four or more resilient members;

wherein the proof mass, the four or more resilient members, and the four or more rigid arms constitute portions of an etched layer; and wherein each of the four or more resilient members is a looped or folded spring, each resilient member connecting the proof mass to a rigid arm of the four or more rigid arms; and further comprising an electrode, wherein the electrode and the proof mass form a parallel capacitor.

10. The MEMS die of claim 9, wherein a first distance between any one of the four or more resilient members and a closest outer edge of the proof mass is less than a second distance between the one resilient member and the anchor.

11. The MEMS die of claim 10, wherein the resonance frequency for translational motion of the proof mass perpendicular to the plane of the proof mass is less than the resonance frequency for translational motion along or rotational motion around any other axis.

12. The MEMS die of claim 10, further comprising top and bottom wafers, and travel stoppers extending from the top and bottom wafers toward the proof mass, wherein one or more of the travel stoppers extends through the proof mass.

* * * * *